United States Patent
Schwaiger et al.

(10) Patent No.: US 6,488,199 B1
(45) Date of Patent: Dec. 3, 2002

(54) METHOD FOR IMPROVING THE MANUFACTURING SAFETY OF WELD JOINTS

(75) Inventors: Jürgen Schwaiger, Reutlingen (DE); Rolf Becker, Pfullingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/674,939
(22) PCT Filed: Feb. 8, 2000
(86) PCT No.: PCT/DE00/00377
§ 371 (c)(1), (2), (4) Date: Dec. 29, 2000
(87) PCT Pub. No.: WO00/54561
PCT Pub. Date: Sep. 14, 2000

(30) Foreign Application Priority Data

Mar. 8, 1999 (DE) .......................................... 199 10 078

(51) Int. Cl.⁷ .............................................. B23K 31/02
(52) U.S. Cl. .................................. 228/122.1; 228/248.1
(58) Field of Search ......................... 228/122.1, 180.21, 228/123.1–208, 248.1, 245; 257/693, 678

(56) References Cited

U.S. PATENT DOCUMENTS

| | | | |
|---|---|---|---|
| 3,664,868 A | | 5/1972 | Davis et al. |
| 3,926,746 A | * | 12/1975 | Hargis |
| 3,988,498 A | * | 10/1976 | Maher |
| 4,563,543 A | * | 1/1986 | Kersuzan et al. |
| 4,681,656 A | | 7/1987 | Byrum |
| 5,235,139 A | * | 8/1993 | Bengston et al. |
| 5,825,086 A | | 10/1998 | Kimura et al. |
| 5,898,218 A | * | 4/1999 | Hirose et al. |
| 6,074,567 A | * | 6/2000 | Kuraishi et al. |

FOREIGN PATENT DOCUMENTS

| | | |
|---|---|---|
| EP | 0 689 245 | 12/1995 |
| FR | 2 148 167 | 3/1973 |
| JP | 61 058 259 | 3/1986 |
| JP | 08 330 173 | 12/1996 |

OTHER PUBLICATIONS

Masatoshi, Satou. 12–96. Translation to JP 08–330173. pp. 1–9.*

* cited by examiner

Primary Examiner—Tom Dunn
Assistant Examiner—Jonathan Johnson
(74) Attorney, Agent, or Firm—Kenyon & Kenyon

(57) ABSTRACT

A method for increasing the manufacturing certainty of soldered connections between a ceramic carrier and a printed-circuit board. It includes the method step of applying a first decomposition-resistant metallization layer on a ceramic carrier and the subsequent imprinting onto the first metallizing layer of a second metallizing layer, improving the wetting performance. In this manner, it is possible to achieve an increase in the overall metallizing layer thickness in the edge area of a soldered connection, whose solder rise in turn makes possible an optical, fully-automatic monitoring of the soldered connection.

13 Claims, 1 Drawing Sheet

METHOD FOR IMPROVING THE MANUFACTURING SAFETY OF WELD JOINTS

FIELD OF THE INVENTION

Using the method according to the present invention for increasing the manufacturing certainty of soldered connections, the quality of the soldered connections can be better monitored by fully automatic soldering-point control systems.

BACKGROUND INFORMATION

In a method for the throughplating using silver conductive paste of printed-circuit boards that are coated on two sides, a printing screen is used that has openings that are assigned to the throughplating holes of the printed-circuit board. In this method, the printing screen, furnished with a silver conductive paste layer, is placed onto the printed-circuit board and the lower side of the printed-circuit board is exposed to an atmospheric partial vacuum, as a result of which the silver conductive paste forms hollow-cylindrical, electrical conductors that contact the walls of the throughplating holes.

Furthermore, it is known from the related art to furnish throughplating holes with a tin-plating to improve the bonding of the solder. However, tin cannot be used in ceramic carriers; sensors arranged on the ceramic carrier could be impaired by the tin-plating applied.

SUMMARY OF THE INVENTION

The method according to the present invention for increasing the manufacturing certainty of soldered connections makes it possible to use fully automatic optical soldering-point control systems having low error rates. In contrast to the known methods for creating throughplatings in printed-circuit boards, the wetting capacity for the solder is significantly improved by applying a second metallizing layer onto a preceding first metallizing layer, which can be composed, for example, of an AgPd thick film paste, so that it is possible to achieve an improved solder rise especially on endplatings on ceramic carriers. The resulting increase in the overall metallizing layer thickness increases the resistance against the decomposition of the metallization in response to soldering, the "leaching" effect.

In ceramic carriers, printed-circuit boards, or the like, throughplatings are produced by a sucking or pressing of conductive materials; endplatings can be produced by separating throughplatings along their lines of symmetry. In producing throughplatings in ceramic carriers or circuit boards, a first metallizing layer is initially applied, onto which, in a second method step, a second metallizing layer is imprinted. In an advantageous manner, a first metallizing layer is made of a corrosion-resistant material, such as AgPd thick film metal. To increase the overall metallizing layer and to improve the wetting capacity of the second metallizing layer, the first metallizing layer is provided with a further metallizing layer. The latter contributes appreciably to an improved wetting capacity of the first metallizing layer as a result of the solder. The second metallizing layer is preferably made of a rare metal layer, such as Au, which has better wetting capacities and whose wetting angle is <60°.

Using the method according to the present invention, it is possible in the edge area of the metallizing layer to achieve a sufficient layer thickness, dimensioned such that there is still material even in the outflow area of the metallizing layer. If there is sufficient metallizing material on hand at that location, the wetting capacity there can be maintained at a high level, in the edge area of the metallizing layer a rise of the solder is assured by the good wetting capacity. This in turn supports the use of fully automatic soldering-point control systems because a solder rise can be achieved in this way which can be reliably detected by a fully automatic soldering-point control system.

Using the application of the second metallizing layer, as called for in the present invention, the overall metallizing layer thickness in the edge area is increased, and the wetting capacity is improved so that the solder rises sufficiently. Since a second metallizing layer, for example of Au, can be affected by the disadvantage of decomposition, this disadvantage is removed by using AgPd as the first metallizing layer. The combination of the two metallizing layers in the production of throughplatings in the ceramic carrier lays the foundation for improving the endplatings generated after the separation of the throughplatings, such that fully automatic soldering-point control systems can be used which check the dimensions of the soldering points, assuring the prerequisite for meaningful fully-automatic measurements, namely a sufficient solder rise.

DETAILED DESCRIPTION

Figure 1:
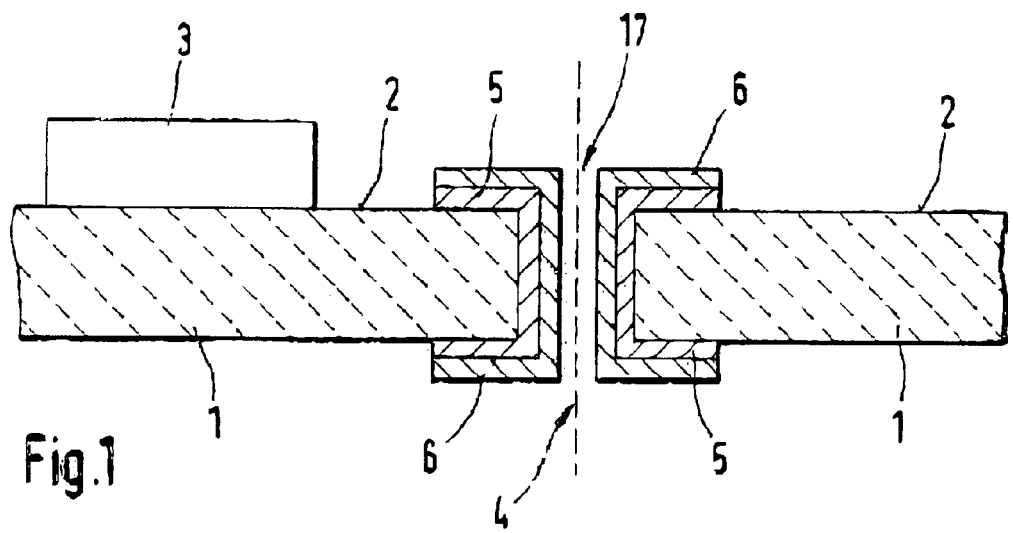
FIG. 1 depicts a ceramic carrier throughplating, furnished with two metallizing layers.

FIG. 1 depicts a ceramic carrier 1, on which a throughplating 17 is produced. On upper side 2 of ceramic carrier 1, there is a sensor element 3. Throughplating 17 is made up of a first metallizing layer 5, which is applied to the edges of ceramic carrier 1; for this purpose, this metallizing layer can be laid down or imprinted through the application of a partial vacuum. This first metallizing layer 5 is preferably composed of a silver conductive paste or an AgPd thick film paste, which has high corrosion resistance and which is very resistant to decomposition, the erosion of the metallization in response to the soldering process. This material requirement is satisfied to a high degree by a first metallizing layer 5 made of AgPd. According to FIG. 1, in a further method step, first metallizing layer 5 is provided with a second metallizing layer 6, which first and foremost improves the wetting properties of first metallizing layer 5. Second metallizing layer 6 is therefore made of a rare metal, for example Au, which improves the wetting.

FIG. 1 depicts a throughplating 17, which is produced on the upper and lower side of ceramic carrier 1; throughplating 17 can have a diameter of, for example, 300 μm. By separating throughplating 17 at separating point 4, endplatings 18 are obtained, as depicted in simplified form, by way of example, in FIG. 2.

Figure 2:
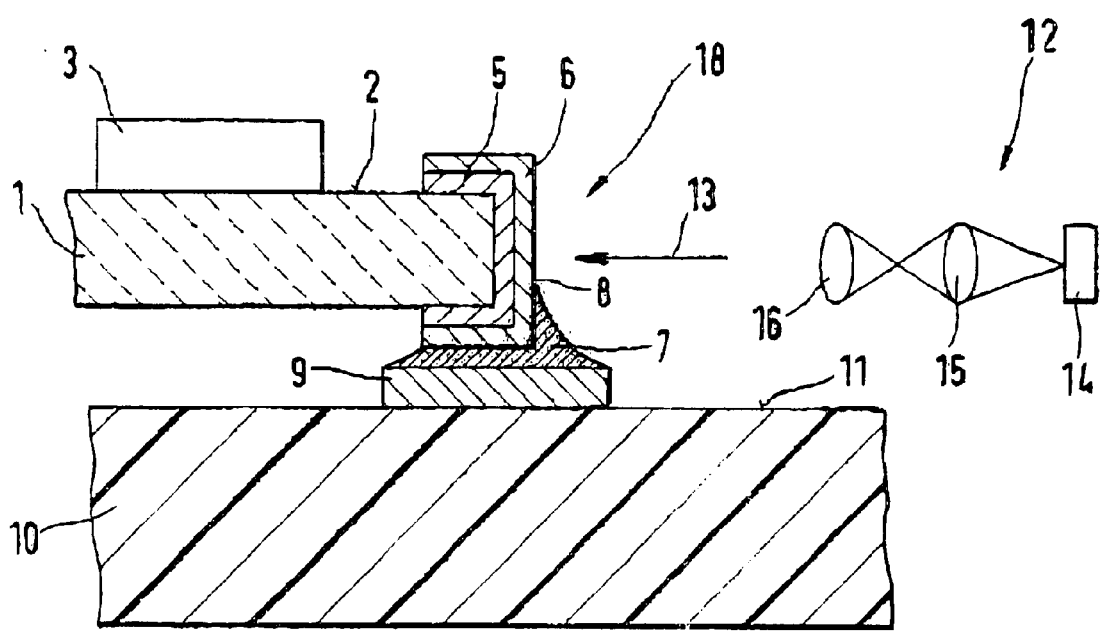
FIG. 2 depicts an endplating configured on a ceramic carrier, opposite which an optical soldering-point control system is arranged.

In the illustration in FIG. 2, a ceramic carrier 1 is depicted whose endplating 18 is produced from a throughplating 17 according to FIG. 1.

After the separation of ceramic carrier 1 at separating point 4, an endplating 18 is produced from throughplating 17 on ceramic carrier 1. Endplating 18, covering the edge area of ceramic carrier 1, is composed, like throughplating 17, of a first metallizing layer 5, for example, AgPd thick film paste, and a second metallizing layer 6, made of Au, for example, or another material that improves the wetting in an advantageous manner. A control optics 12 is arranged opposite endplating 18. The control optics includes a radiation source 14, a convergent lens 15, and a lens 16 that focuses beam of rays 13 onto soldered connection 7 to be detected. Connected to control optics 12 is an evaluation unit that is not depicted here in detail, which can make possible an evaluation of the measuring results obtained by control optics 12.

Endplating 18 is connected via a soldered connection 7 to a base that is arranged perpendicular to the endplating, the base being accommodated on the upper side of a printed-circuit board 10. The quality of a soldered connection 7 can advantageously be monitored and measured by measuring the solder rise of solder track 7 in edge area 8 of the soldered connection, and a conclusion is reached therefrom as to whether soldered connection 7 is correct or faulty. By imprinting second metallizing layer 6, it is achieved, as a result of the sharply improved wetting, that the solder rise is such that its edge area 8 is detected by beam of rays 13 of control optics 12. In a soldered connection that is not executed correctly, a solder rise extending into edge area 8 would not be assured, the solder rise would not extend to the area accessible to detection by beam of rays 13, soldered connection 7 would therefore be identified by the evaluation unit, arranged downstream of the control optics 12, as not correct.

In the use of a second metallizing layer 6, which improves the wetting capacity of first metallizing layer 5, the prerequisite for a solder rise extending into the area accessible to detection by beam of rays 13 is met. This fundamental prerequisite is the same for all soldered connections to be produced. Since all soldered connections 7 can be produced under conditions that favorably affect the flow behavior of the solder, the reliability of the measurements by control optics 12 is very high. In automated production processes, fully automatic optical control devices 12 can therefore be used for monitoring the quality of soldered connections 7.

According to the present invention, the imprinting of a second metallizing layer 6 onto first metallizing layer 5 also has the advantage that, in imprinting first metallizing layer 5, it is impossible for technical reasons to compensate for insufficient layer thickness in the edge area. If in the edge area the layer thickness is too small, then the decomposition of the metallizing layer begins there, which is to be prevented. By imprinting second metallizing layer 6, only the undesirable overall layer thickness of the AgPd layer thickness is prevented; the use of a second metallizing layer 6 made of a material that improves the wetting capacity of first metallizing layer 5 makes possible both a sufficient overall layer thickness in the edge area as well as a sufficient solder rise at soldered connection 7 of endplating 18, which can reliably be detected optically.

The criterion for selecting second metallizing layer 6 is the wetting behavior, which can be characterized by the wetting angle □. A wetting angle $\alpha$ of 0° characterizes an excellent wetting behavior, whereas a wetting angle $\alpha=90°$ is a decidedly unfavorable wetting behavior. The AgPd thick film paste, selected as first metallizing layer 5, has a wetting angle $\alpha$ of 60°.

What is claimed is:

1. A method for increasing a manufacturing certainty of a soldered connection between a ceramic carrier and a circuit board, comprising the steps of:

applying a first decomposition-resistant metallizing layer on the ceramic carrier;

imprinting a second metallizing layer onto the first decomposition-resistant metallizing layer in order to improve a wetting performance, wherein an overall metallizing layer thickness of a throughplating in an edge area of the soldered connection is increased; and separating the ceramic carrier in an area of the throughplating.

2. The method according to claim 1, further comprising the step of:

providing the throughplating with the first decomposition-resistant metallizing layer, the first decomposition-resistant metallizing layer including a thick film paste.

3. The method according to claim 1, further comprising the step of:

imprinting the second metallizing layer onto the throughplating.

4. The method according to claim 1, wherein:

the first decomposition-resistant metallizing layer includes a corrosion-resistant material.

5. The method according to claim 1, wherein:

the first decomposition-resistant metallizing layer includes a thick film paste formed of AgPd.

6. The method according to claim 1, wherein:

the second metallizing layer includes a rare metal layer having a good wetting capacity.

7. The method according to claim 1, wherein:

the second metallizing layer includes Au.

8. The method according to claim 1, wherein:

the second metallizing layer includes a material having a wetting angle of $\alpha<60°$.

9. The method according to claim 1, wherein:

an endplating on the ceramic carrier corresponds to one half of a throughplating.

10. The method according to claim 9, further comprising the step of:

positioning the soldered connection at the endplating and at a base running perpendicular thereto.

11. A method for increasing a manufacturing certainty of a soldered connection between a ceramic carrier and a circuit board, comprising the steps of:

applying a first decomposition-resistant metallizing layer on the ceramic carrier, wherein the first decomposition-resistant metallizing layer includes a thick film paste of a corrosion-resistant material; and imprinting a second metallizing layer onto the first decomposition-resistant metallizing layer in order to improve a wetting performance, wherein the second metallizing layer includes a material having a wetting angle of $\alpha<60°$, and an overall metallizing layer thickness of a throughplating in an edge area of the soldered connection is increased.

12. A method for increasing a manufacturing certainty of a soldered connection between a ceramic carrier and a circuit board, comprising the steps of:

applying a first decomposition-resistant metallizing layer on the ceramic carrier, wherein the first decomposition-resistant metallizing layer includes a thick film paste of a corrosion-resistant material;

imprinting a second metallizing layer onto the first decomposition-resistant metallizing layer in order to improve a wetting performance, wherein the second metallizing layer includes a material having a wetting angle of α<60°, and an overall metallizing layer thickness of a throughplating in an edge area of the soldered connection is increased; and the ceramic carrier in an area of the throughplating.

13. A method for increasing a manufacturing certainty of a soldered connection between a ceramic carrier and a circuit board, comprising the steps of:

applying a first decomposition-resistant metallizing layer on the ceramic carrier, wherein the first decomposition-resistant metallizing layer includes a thick film paste of AgPd;

imprinting a second metallizing layer onto the first decomposition-resistant metallizing layer in order to improve a wetting performance, wherein the second metallizing layer includes Au, and wherein an overall metallizing layer thickness of a throughplating in an edge area of the soldered connection is increased; and separating the ceramic carrier in an area of the throughplating.

* * * * *